SELF-CENTERING, PROPORTIONATING WAFER FIXTURE
Filed April 10, 1963
FIG. 1
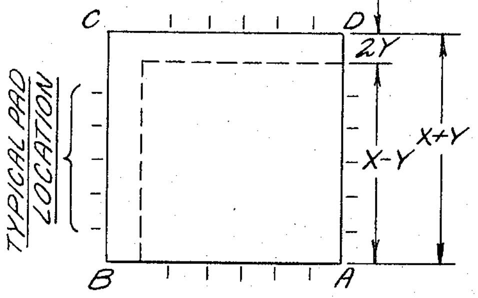
FIG. 2
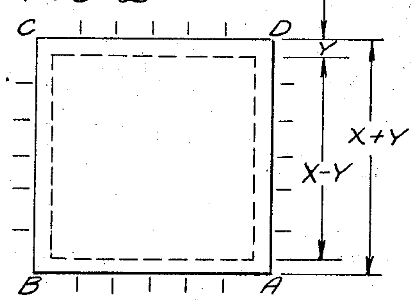
FIG. 3
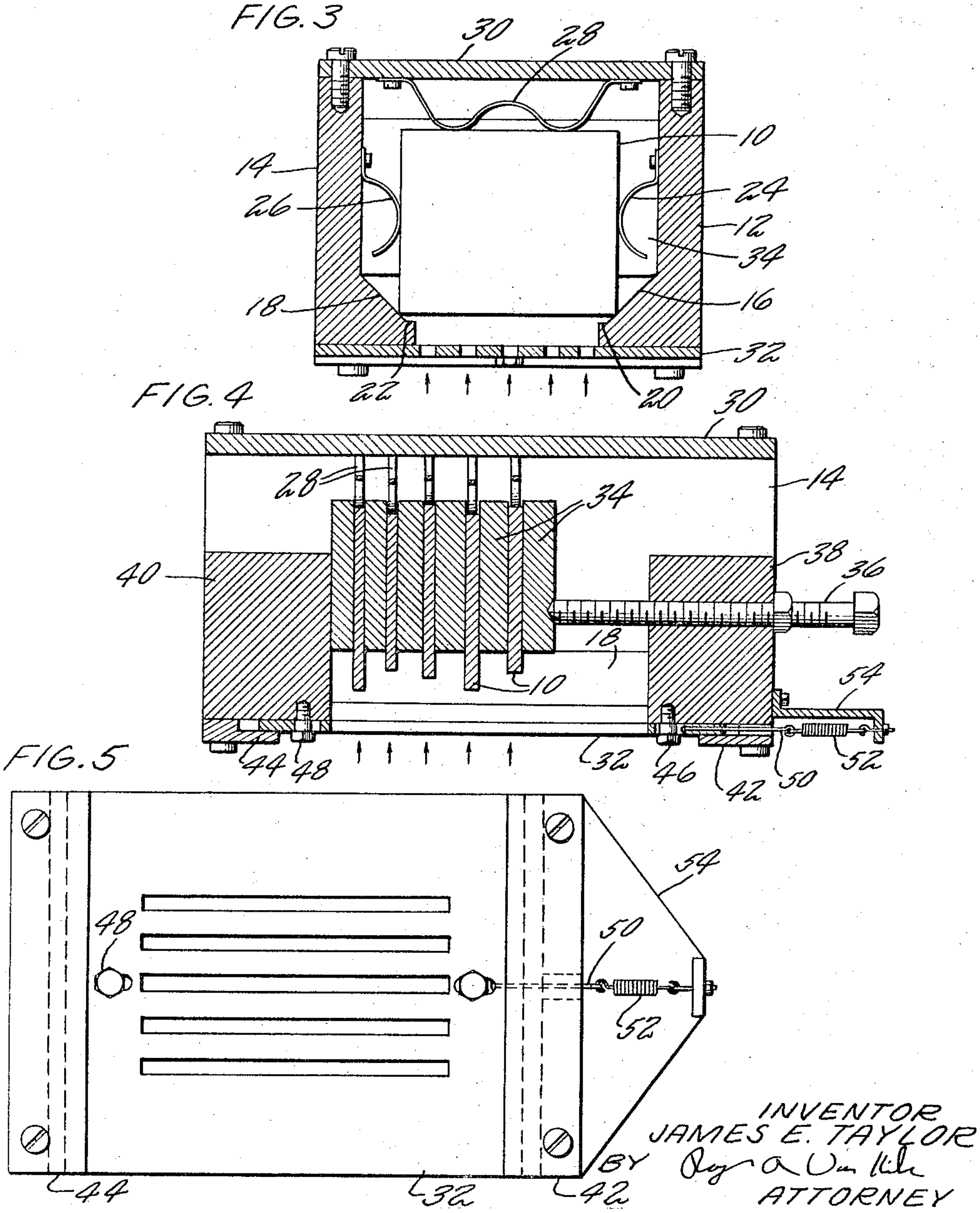
FIG. 4, FIG. 5
INVENTOR
JAMES E. TAYLOR
BY [signature]
ATTORNEY United States Patent Office 3,315,637
Patented Apr. 25, 1967

3,315,637
SELF-CENTERING, PROPORTIONATING WAFER FIXTURE

James E. Taylor, Windsor Locks, Conn., assignor to United Aircraft Corporation, East Hartford, Conn., a corporation of Delaware Filed Apr. 10, 1963, Ser. No. 272,140
1 Claim. (Cl. 118—503)

My invention relates to the fabrication of microelectronic devices. More particularly, my invention is directed to the deposition of conductive, resistive and semiconductive materials on elements which go into microminiaturized electronic circuits.

One continuous and consistent trend in the history of electronics has been the reduction in the size and weight of the assembly needed for any particular function. The term generally applied to this trend is microminiaturization. Of the several approaches to microminiaturization, most employ passive and/or active circuit components and conductive paths which have been formed by the deposition of thin films of the proper materials on substrates. These substrates are, in the most usual instances, thin wafers of ceramic or glass material which may have electronic circuits formed on both sides thereof by vapor deposition or other metalizing processes. It is desirable to use ceramic materials for the substrates since these materials are insulators, they are relatively strong and light weight and further because they have superior heat transfer characteristics when compared to conventional epoxy resin circuit boards. For example, because of its inherent high thermal conductivity, beryllium oxide is a most desirable substrate material for applications where high thermal loads are anticipated such as in servo amplifiers.

In practice, in order to perform a complex electronic function, it is necessary to stack a plurality of substrate boards or wafers and to then provide for interconnections between the circuits on said wafers. The usual and, from a fabrication standpoint, easiest manner of making such interconnections is to terminate the circuits on each wafer at a plurality of contact pads which have been deposited on one or more edges of the wafer. The wafers are than stacked by standing them on edge in a fixture and parallel horizontal conductors extending between the several wafers are provided. It is required that these horizontal conductors be joined to contact pads on each wafer. The latter is necessary even when a particular contact pad on one of the wafers is isolated from the circuits on that wafer in order to give strength to the final structure.

Extreme difficulty is experienced in trying to make the aforementioned interconnections. This difficulty arises from the fact that, due to manufacturing tolerances, the substrate wafers will vary in size. In the prior art, the substrate wafers were fixtured for the deposition of material thereon by referencing any one point on the periphery of the wafer. Given square wafers nominally $x$ inches on a side with a tolerance of $\pm y$ inches, positioning by reference to one point on the periphery resulted in accumulated tolerances or a possible error of $2y$ inches. Due to these accumulated tolerances, it has been necessary to painstakingly bend the conductors so that they would rest on the appropriate contact pads on each wafer. Once so positioned, the conductors are welded, soldered or brazed to the contact pads to complete the assembly. However, as can be well imagined, the time consuming operation of bending the conductors adds tremendously to the cost of the microminiature circuit. The extent of this problem will be understood when it is realized that there may be as many as twenty contact pads deposited on each edge of a .6 inch square wafer and that the individual wafers in a stack are spaced 0.015 inch apart.

My invention overcomes the above explained problem by providing a novel fixture for supporting elements which it is desired to have contact pads or other circuit elements deposited on so that the tolerances involved are distributed rather than accumulated.

It is therefore an object of my invention to provide for the fixturing of substrates for a metalizing process.

It is another object of my invention to distribute the tolerances involved in the vapor deposition of materials on a substrate.

It is also an object of my invention to reduce the cost of and expedite the assembly of microminiature electronic devices.

It is yet another object of my invention to provide a novel fixture for use in a vapor deposition apparatus.

These and other objects of my invention are accomplished by a novel fixture which distributes the tolerances during a vapor deposition process by centering the substrates regardless of their size so that contact pads or other circuit elements may be deposited thereon equally spaced in both directions from the center of the side of the wafer which is exposed to the vapor.

My invention may be better understood and its numerous advantages will become apparent to those skilled in the art by reference to the accompanying drawing in which like reference numerals refer to like elements in the various figures and in which:

FIGURE 1 represents a substrate wafer positioned for the deposition of contact pads thereon by a prior art method wherein tolerance errors accumulate.

FIGURE 2 represents a substrate wafer positioned in accordance with my invention so that the tolerances are distributed.

FIGURE 3 is a sectional end view of the novel fixture which comprises this invention.

FIGURE 4 is a sectional side view of the fixture of FIGURE 3.

FIGURE 5 is a bottom view of the fixture of FIGURES 3 and 4.

Referring now to FIGURES 1 and 2, the deficiencies of the prior art and the advantages realized through use of my invention can be easily seen. Given the square wafers of FIGURES 1 and 2 which are nominally $x$ inches on a side with a tolerance of $\pm y$ inches, assume that the wafer of FIGURE 1 is one of a plurality of wafers which were fixtured for the deposition of contact pads on all four edges thereof by referencing from point A on the peripheries thereof in accordance with the teachings of the prior art. Contact pads will thus be formed on all four edges of the wafers in the positions shown on FIGURE 1. The broken line in FIGURE 1 indicates the size of the smallest of the plurality of wafers. When the wafers metalized in accordance with the process depicted in FIGURE 1 are later stacked for conductor attachments thereto, lateral conductor alignment can be preserved only by fixturing again from the same reference point A. In this manner conductors can be attached to edges AB and AD of the wafers in the stack without particular trouble. However, as can be seen from FIGURE 1, severe vertical alignment problems are encountered in attaching the conductors to edges BC and CD of the assembly. Thus, to make proper contact so that the conductors may be joined to the pads, it may be necessary to bend the conductors, in the case of sides CD, vertically by as much as $2y$ inches between each wafer of the stack. Short of imposing economically restrictive tolerances on the manufacture of the wafers, the only solution to the aforementioned problem is to distribute the tolerances. The wafer depicted in FIGURE 2 was fixtured for the deposition of contact pads in accordance with my invention thereby resulting in distributed tolerances. The manner in which this is accomplished will be described in detail below. It can be seen from FIGURE 2 that distributing the tolerances results in a maximum error of $y$ inches which, while not perfect, will permit attachment of the conductors to the contact pads without the time consuming step of bending the conductors. That is, the conductors are flexible enough so that they will sag $y$ inches.

Referring now to Figure 3, a cross-sectional end view of the fixture which comprises my invention is shown. The fixture is shown with a substrate wafer 10 positioned therein. Wafer 10 will typically have dimensions of .60 x .60 x .01 inch and will be of a substance that is compatible with vapor deposited materials such as Nichrome, aluminum, copper, gold, silver, tantalum, and chromium. The wafer 10 of FIGURE 3 is fixtured for the deposition of contact pads on an edge thereof. In practice, contact pads will be deposited on all four edges of the wafer in four separate steps after which the desired thin film circuit will be formed on either side of the wafer. The thin film circuit will terminate at the contact pads. The pads typically will have a width of .011 to .015 inch and will be spaced on .025 inch centers. Thus, where twenty pads are deposited on an edge of a .60 inch square wafer, the insulating space between the pads will be a minimum of .01 inch. After formation of the thin film circuits, the wafers will be stacked and electrically interconnected by riser wires which may be copper ribbons having dimensions of .002 x .010 inch. A desirable methods of attaching the riser wires to the contact pads is welding with an electron beam.

The fixture of FIGURE 3 comprises a pair of sides 12 and 14 which respectively have tapered portions 16 and 18 which slope inwardly. In addition, sides 12 and 14 also respectively have lips 20 and 22 at the bottom thereof to provide for masking the corners of the wafers positioned in the fixture. Attached to sides 12 and 14 are respective spring members 24 and 26 which tend to insure that the wafers are centered between the sides. There will be a pair of spring members for each wafer that is placed in the fixture. The wafer is prevented from cocking in the fixture by a further spring member 28, one of which is also provided for each wafer, which is affixed to a member 30 which comprises the top of the fixture. Bridging the space between the bottoms of the two side walls 12 and 14 is an apertured mask 32. Vapor from a source of evaporant will pass through the apertures in mask 32 and will condense on the bottom edge of wafer 10.

Referring now to FIGURE 4, there is shown a side view of the fixture of FIGURE 3. As can be seen from FIGURE 4, the wafers 10 are separated in the fixture by spacers 34. Spacers 34 are of such width that they will span the space between the side walls above the tapered portions 16 and 18. In order that the wafers and spacers will remain in vertical position, a set screw 36 extends through a shoulder 38 and engages a depression in the last spacer. It should be noted that shoulders 38 and 40 extend between the side walls at either end of the fixture and are attached to said side walls by suitable means, such as welding. Attached to the lower sides of shoulders 38 and 40 respectively are support members 42 and 44 which support the ends of mask 32. Mask 32 is placed in position by sliding under supports 42 and 44. Proper positioning and alignment of the mask is insured by inserting bolts 46 and 48 through slots provided therefor in the mask. As can be more clearly seen from FIGURE 5, the slot in one end of mask 32 is engaged by a hook 50 which is in turn attached to a spring 52. Spring 52 is supported from shoulder 38 by a bracket 54. It is the purpose of spring 52 to apply tension to mask 32 to prevent warping of the mask as it becomes overheated due to thermal radiation from the evaporation source. It should be noted that the entire fixture is normally heated by a separate source of thermal energy in order to make the wafers themselves hot enough to achieve optimum film adhesion thereto. It is the warping of the mask due to overheating that the spring tension overcomes.

In practice, the wafers are inserted in the fixture by removing top member 30 and are prevented from cocking by the combined action of the three springs pressing against each wafer. Due to the tapered portions of the two sides, the wafers will be inserted in the fixture to a depth which is a function of their width; the smallest wafer being inserted to the lowest depth. The mask is then inserted in the bottom of the fixture and the assembly placed in a high vacuum deposition apparatus. If desired, the fixture may be held by another member in the vapor deposition apparatus such that it may be oscillated or rotated about two axes. The metal vapor source is located a considerable distance from the wafer fixture so as to provide a nearly collimated beam of vapor atoms. As evaporation of the charge material in the vapor source of the vacuum deposition apparatus is carried out, the fixture may be rotated. Rotation of the fixture about a point midway between the edges will achieve a thickening of the deposit on the edge. The largest wafers, those farthest from the source, will have pads deposited thereon which are proportionally larger that those deposited on the wafers nearer the source. The angle measured from the vertical through which the fixture is rotated, the angle of the tapered portion of the two sides of the fixture and, to some degree, scattering of metal atoms at the mask slot edges will determine the maximum width of the deposited pads.

While a preferred embodiment has been shown and described, various modifications and substitutions may be made without deviating from the scope and spirit of my invention. For example, while my invention has been shown and described in connection with the deposition of contact pads on the edges of substrate wafers it also has utility in any metalizing process performed on the sides of a substrate. Thus my invention is described by way of illustration rather than limitation and accordingly it is understood that my invention is to be limited only by the appended claim taken in view of the prior art.

I claim:

Apparatus for fixturing articles for the deposition of vapor thereon comprising:

- a first side wall having at least a portion thereof tapered inwardly,
- a second side wall displaced from and facing said first wall and having at least a portion thereof tapered inwardly,
- means for supporting the articles centrally between said walls with edges thereof resting on opposite tapered wall portions,
- means for urging the supported articles against the tapered wall portions,
- a first end wall extending between and affixed to first ends of the side walls,
- a second end wall extending between and affixed to the second ends of the side walls,
- an apertured mask,
- means on the bottom of said first end wall for supporting said apertured mask, and
- means on the bottom of said second end wall for slidingly supporting said mask and including spring means for applying tension to the apertured mask whereby upon elevated temperatures of vapor deposition warping of said mask is inhibited.

References Cited by the Examiner

UNITED STATES PATENTS

| | | | |
|---|---|---|---|
| 2,006,451 | 7/1935 | Glidden | 269—287 X |
| 2,745,773 | 5/1956 | Weimer. | |
| 2,796,041 | 6/1957 | Banzhof | 118—503 |
| 3,103,352 | 9/1963 | Steffen | 269—269 |

MORRIS KAPLAN, *Primary Examiner.*